Nov. 12, 1968 P. JÖRGENSEN 3,411,019

ELECTRONIC CONVERTER AND SWITCHING MEANS THEREFOR

Filed March 25, 1965

INVENTOR.
PIERRE JÖRGENSEN
BY
Bauer and Seymour
ATTORNEYS

United States Patent Office 3,411,019
Patented Nov. 12, 1968

3,411,019

ELECTRONIC CONVERTER AND SWITCHING MEANS THEREFOR

Pierre Jörgensen, L'Hay-les-Roses, France, assignor to Compagnie de Saint-Gobain, Neuilly-sur-Seine, Hauts-de-Seine, France Filed Mar. 25, 1965, Ser. No. 442,592
Claims priority, application France, Mar. 26, 1964, 968,763
17 Claims. (Cl. 307—243)

ABSTRACT OF THE DISCLOSURE

An electronic commutation circuit comprising two electronic valves of opposite polarity, such as an NPN type transistor and a PNP type transistor, the emitter of one and the collector of the other having signal voltages of predetermined maximum and minimum values applied thereto, the remaining emitter and collector being connected to a common terminal, and the base terminals thereof being connected to a common source of conduction control signals, each through a resistor, said control signals having voltage potentials at least as small as said minimum value or at least as great as said maximum value relative to a common reference value. A circuit having components similarly connected and the predetermined maximum voltage applied to said common terminal. The combination of a plurality of such commutation circuits for converting reflected binary numbers to pure binary numbers and the combination of such a commutator circuit with a bistable multi-vibrator as a source of said maximum and minimum signal voltages.

This invention relates to electrical apparatus and more particularly to electronic switching means adapted among other things for uses in circuits for performing various operations in electronic calculators and the like.

One of the objects of the present invention is to provide novel transistorized circuitry of the above character.

Another object of the invention is to provide a novel combination of electrical transistors which is useful in constructing simplified circuitry for performing arithmetical, algebraic and logical operations in computing apparatus.

Still another object is to provide electronic switching means which functions in a novel and simplified manner to control the flow of electrical energy more effectively and efficiently than prior known means for the same and similar purposes.

A further object is to provide a novel type of transistorized electrical circuit which lends itself readily to combination with other known circuit components in simplified digital and analog type calculating machines capable of performing computations with reduced formalism and increased speed and accuracy.

The above and further objects and novel features of the invention will more fully appear from the following detail description when the same is read is connection with the accompanying drawings. It is to be expressly understood, however, that the drawings are for the purpose of illustration only and are not intended as a definition of the limits of the invention.

In the drawings, wherein like reference characters refer to like parts throughout the several views.

Figures 1, 2, 3, 4:
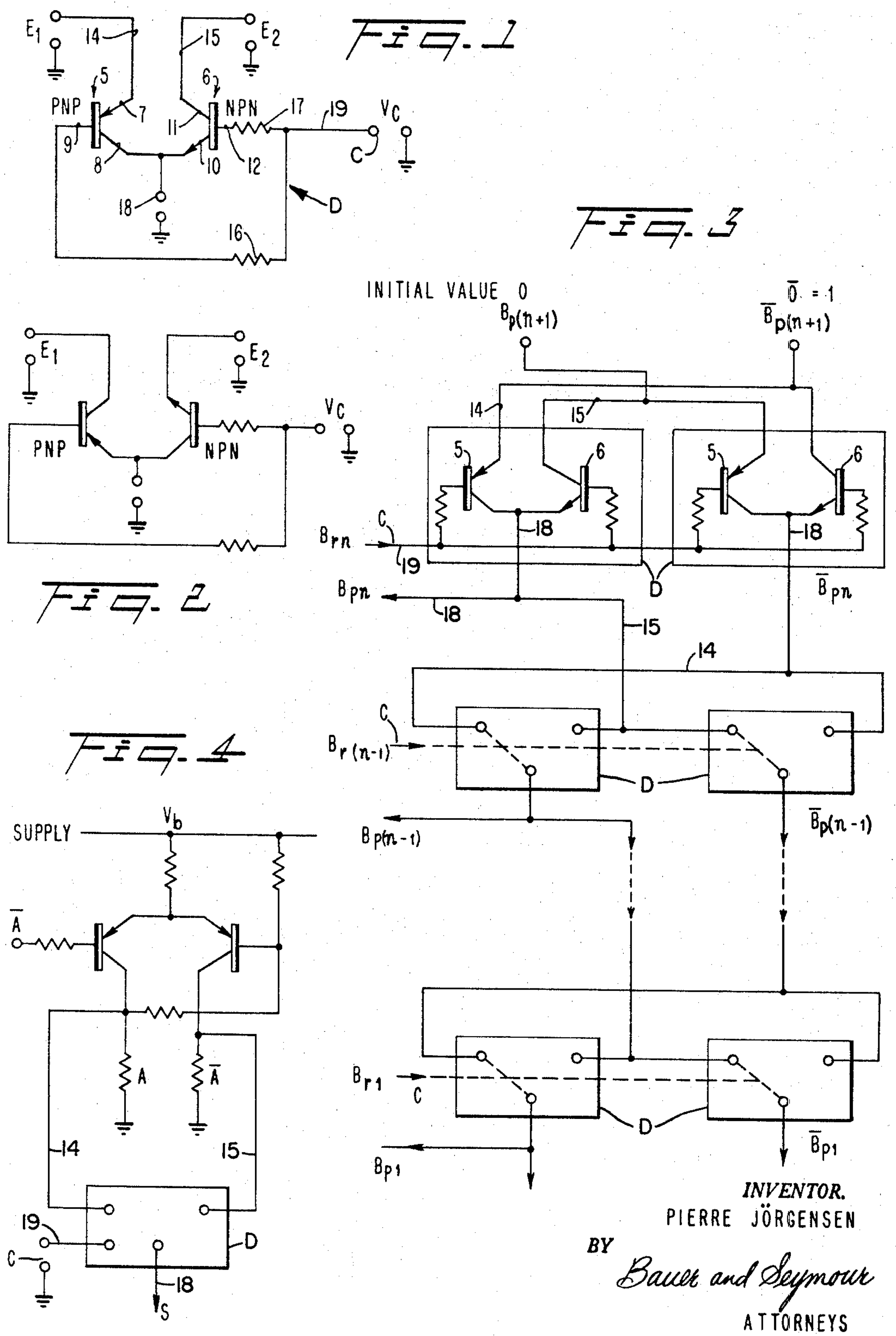
FIGS. 1 and 2 are schematic wiring diagrams illustrating two modifications of electrical circuitry embodying the invention.
FIG. 3 is a block diagram illustrating one of the various uses of the circuits of FIGS. 1 and 2.
FIG. 4 is a schematic wiring and block diagram illustrating another use for the invention in electronic computer circuitry.

The embodiment of this invention illustrated, by way of example, in FIG. 1 is adapted for use as an electronic commutation circuit D and in the form shown, comprises two junction type transistors 5 and 6 connected in a novel manner to different signal input sources and a common output terminal or bus bar. Transistor 5 is of the PNP type having an emitter 7, a collector 8, and a base 9. Transistor 6 is of the NPN type having an emitter 10, a collector 11, and a base 12.

The emitter 7 of transistor 5 and the collector 11 of transistor 6 are connected by leads 14 and 15, respectively, to sources of controlled signal voltage $E_1$ and $E_2$. The base terminals 9 and 12 of the transistors are connected, respectively, through resistances 16 and 17 of equal value to a lead and a control terminal C to which a triggering or control voltage $V_c$ may be applied for determining the on and off conditions or states of transistors 5 and 6 in a manner to be hereinafter pointed out. The collector 8 of transistor 5 and the emitter 10 of transistor 6 are each connected to a common bus bar or lead 18. Thus, the emitter-collector paths through both transistors are connected to the common lead 18.

The signal voltages $E_1$ and $E_2$ are preferably maintained at predetermnied maximum and minimum values in relation to a reference point which should be the same as the reference for the control voltage $V_c$ and as illustrated, may be ground. For computer purposes, the maximum or greater vaule of the voltages $E_1$ and $E_2$ may be symbolically represented by the binary number 1, while the minimum or lesser value thereof may be represented by the binary number 0 or comparable symbols.

It will be apparent that in the novel circuitry described above, transistor 5 will be unconditionaly conductive in both directions across the emitter-collector path thereof and hence, betwen leads 14 and 18 when the base bias or control voltage $V_c$ is equal to or less than the controlled minimum value of voltage $E_1$. Under the same conditions, transistor 6 will be blocked or non-conductive across its emiter-collector path. Similarly, when the control voltage $V_c$ is equal to or greater than the controlled maximum value of the voltage $E_2$, transistor 6 will be conductive across its emitter-collector path, and transistor 5 will be switched to blocked or non-conductive condition.

There is thus provided a unique electrical switching circuit of utmost simplicity whereby a common lead 18 may be alternately and selectively connected to either one of two leads 14 and 15 for two-way conduction. The circuit functions as a high speed, highly efficient relay which does not permit any connection between leads 14 and 15.

In applications wherein transistors 5 and 6 control the flow of energy from leads 14 and 15 to the common lead or terminal 18, it is preferable to use normal high current gain emitters. If transmission of power is to be from common lead 18 to the leads 14 and 15, transistors of the type schematically illustrated in FIG. 2 are preferable.

The novel circuit thus contemplated by the invention may be utilized in a variety of applications and in numerous ways. By way of example, the same may be advantageously used for converting reflected binary numbers into straight or pure binary numbers. In a pure binary number $B_p$ a digit of rank or position $n$ identified as $B_{pn}$ can be expressed as a function of the pure binary digit $B_{p(n+1)}$ of next higher rank and as a function of the digit of the same rank or position $n$, identified as $B_{rn}$, of the reflected binary number $B_r$, as follows:

$$B_{pn}=B_{p(n+1)} \text{ if } B_{rn}=0$$

In performing a conversion of the above nature in a computer, one always starts with the binary digit having the greatest weight. It will be seen that a circuit embodying the present invention is capable of carrying out this conversion operation, but considering the fact that one must have at every moment the contrary value of the pure binary number, the following operation must be added:

$$B_{pn}=B_{p(n+1)} \text{ if } B_{rn}=1$$
$$B_{pn}=B_{p(n+1)} \text{ if } B_{rn}=0$$

Accordingly, the conversion requires two circuits embodying the invention. The schematic block diagram of FIG. 3 illustrates a conversion device comprising three pairs of circuits or switching arrangements contemplated by the invention, each rectangular block representing a circuit in accordance with either of FIGS. 1 or 2. This device is sufficient for such conversion operation on binary numbers consisting of three digits or bits. For the conversion of binary numbers consisting of a greater number of digits, the device must include a pair of circuits according to the invention for each digit of the number.

Circuits embodying the invention are also useful in computers for the performance of the logical operation of extracting. In on-off or flip-flop situations, such circuits may be used for extracting the values of A and $\bar{A}$ of a binary number. This may be easily accomplished by connecting a circuit D comprehended by the invention (schematically shown as a rectangle in FIG. 4) to known components in the manner illustrated in FIG. 4. The logical equation for this device is:

$$S=A \text{ if } C=0$$
$$S=\bar{A} \text{ if } C=1$$

Although only a limited number of embodiments of the invention have been illustrated in the accompanying drawings and described in detail in the foregoing specification, it is to be expressly understood that the invention is not limited thereto. Various changes may be made in the details of the circuitry to adapt the invention to different uses and to other associated circuit components, as will now be apparent to those skilled in the art.

What is claimed is:

1. An electronic commutation circuit comprising two transistors, one of said transistors being of the PNP type and the other being of the NPN type, the collector of one transistor and the emitter of the other transistor being connected to a common terminal, the remaining emitter and collector of said transistors each having predetermined maximum and minimum signal voltages selectively applied thereto and the bases of said transistors being connected each through a resistor to a common control terminal, said resistors being of equal value, and having selectively applied thereto a signal voltage at least as great as said predetermined maximum signal voltage or at least as small as said predetermined minimum signal voltage, whereby said NPN type transistor is rendered conductive when said maximum or greater signal voltage is applied to said control terminal and said PNP type transistor is rendered conductive when said minimum or smaller signal voltage is applied to said control terminal.

2. An electrical commutation circuit comprising a PNP type transistor, an NPN type transistor, means connecting the emitter of one transistor and the collector of the other transistor to a common terminal, means connecting the remaining emitter and collector of said transistors respectively to separate sources of signal voltages of different magnitudes, and means connecting the base terminals of said transistors selectively to sources of control voltage at least as great as the larger or at least as small as the smaller of said signal voltages.

3. An electrical commutation circuit as defined in claim 2 comprising a resistor connected between the base terminal of each of said transistors and said sources of control voltage, said resistors being of equal value.

4. An electrical switching or relay circuit comprising two separate input lines, each of said lines being free of any electrical connection to the other of said lines, means for applying controlled signal voltages to said lines having predetermined maximum and minimum values, a common output line, a normally non-conductive solid state electronic valve connected between each said input line and said output lines, and means simultaneously connecting each of the control terminals of said valves through a resistor directly to a common source of variable direct current control voltage, said valves being of opposite conductivity and so connected to said input and output lines that only one said valve is rendered conductive when the control voltage does not exceed said minimum signal voltage and only the other of said valves is rendered conductive when the control voltage is not less than said maximum signal voltage.

5. An electrical switching or relay circuit comprising first and second input lines, means for applying signal voltages of predetermined different magnitudes to said first and second input lines, respectively, a common output line, a common control line, first and second normally non-conductive transistors of opposite conductivity, each said transistor having a control terminal connected to said common control line, each of said transistors having another terminal connected to said common output line and said first and second transistors each having a further terminal connected to said first and second input lines, respectively, and being free of electrical connection externally of said transistors to said control terminals, and means for selectively connecting said common control line to sources of control voltage at least as great as the larger or at least as small as the smaller of said signal voltages.

6. An electrical switching or relay circuit comprising two separate input lines, means for applying controlled signal voltages to said lines having predetermined maximum and minimum values, a common output line, a normally non-conductive transistor connected between each said input line and said output line, one of said transistors being of the PNP type and the other being of the NPN type, the collector of one of said transistors and the emitter of the other of said transistors being connected to each other and to said output line, and means connecting each of the control terminals of said transistors through a resistor directly to a common source of variable direct current control voltage, said transistors being so constructed and connected to said input and output lines that only one said transistor is rendered conductive when the control voltage does not exceed said minimum signal voltage and only the other of said transistors is rendered conductive when the control voltage is not less than said maximum signal voltage.

7. An electrical circuit as defined in claim 4 comprising resistors of equal value connected between said source of control voltage and the control terminal of each of said valves.

8. In electrical apparatus, the combination comprising a first PNP type transistor, a second NPN type transistor, a first circuit connecting the emitter of said first transistor to a point of reference potential, such as ground, a second circuit connecting the collector of said second transistor to said point, circuit means connecting the base of each of said transistors to said point, each through a resistor, said resistors being of equal value, means connecting the collector of said first transistor to the emitter of said second transistor and to a common load circuit, means for applying a control voltage to said bases through said circuit means, and means for applying signal voltages to said first and second circuits, said signal voltages having predetermined maximum and minimum values.

9. In combination, a first PNP type transistor, a second NPN type transistor, a bi-stable (flip-flop) multi-vibrator, means connecting the emitter of said first transistor to an output terminal of said multi-vibrator, means connecting the collector of said second transistor to another output terminal of said multi-vibrator, means connecting the remaining emitter and collector of said transistors to a common conductor, and means for applying a variable control voltage to the base terminals of both transistors simultaneously.

10. In combination, first and second commutator units each comprising a PNP type transistor, an NPN type transistor, each transistor having collector, emitter and base electrodes, and means connecting the emitter electrode of one transistor to the collector electrode of the other transistor and to a common load circuit, circuit means connecting the base electrodes of all said transistors, each through a different resistance, to a common terminal, a first circuit connecting the remaining emitter electrode of said first unit and the remaining collector electrode of said second unit in parallel to a first source of signal voltage of predetermined magnitude, a second circuit connecting the remaining collector electrode of said first unit and the remaining emitter electrode of said second unit in parallel to a second source of signal voltage of predetermined magnitude different from the magnitude of the voltage of said first-named source, and means for applying a variable control voltage to said common terminal having a magnitude either at least as small as the smaller of said signal voltages or at least as great as the larger of said signal voltages.

11. Apparatus as defined in claim 10 wherein the control voltage renders the NPN type transistors of said units simultaneously conductive while the PNP type transistors are blocked.

12. Apparatus as defined in claim 10 wherein in each said unit the collector electrode of the PNP type transistor and the emitter electrode of the NPN type transistor are connected to each other and to said common load circuit.

13. Apparatus as defined in claim 10 wherein the collector electrode of the NPN type transistor of one said unit and the emitter electrode of the PNP type transistor of the other said unit are connected to one of said sources of signal voltage.

14. Apparatus for controlling the transmission of electrical energy between a transmission line and two sources of signal voltages having different predetermined values, comprising a first PNP type transistor connected between said line and one of said sources, a second NPN type transistor connected between said line and the other of said sources, each said transistor having a collector, an emitter and a control terminal, the collector of one transistor and the emitter of the other transistor being connected to said transmission line, and a source of control voltage simultaneously connected to the control terminal of each of said transistors, one of said transistors being rendered conductive when said control voltage is at least as great as the larger of said signal voltages and the other of said transistors being rendered conductive when the control voltage is at least as small as the smaller of said signal voltages.

15. An electronic commutator circuit comprising an NPN transistor, a PNP transistor, each said transistor having an emitter, a collector and a base, means connecting the collector of one transistor and the emitter of the other transistor to a common terminal, means for applying a predetermined voltage to the emitter of said one transistor, means for applying a different predetermined voltage to the collector of said other transistor, means for connecting the bases of said transistors, each through a resistor to a control terminal, and means for selectively applying to said control terminal a voltage which is equal to or less than the smaller of said predetermined voltages or equal to or greater than the larger of said predetermined voltages, whereby to selectively render one or the other of said transistors conductive across the emitter-collector path thereof.

16. In electrical apparatus the combination of a PNP type transistor, an NPN type transistor, a first circuit connecting the collector of one of said transistors to a point of reference potential such as ground, a second circuit connecting the emitter of the other transistor to said point, circuit means connecting the base of each of said transistors to said point, each through a resistor, said resistors being of equal value, means connecting the emitter of said one transistor to the collector of said other transistor and to a common load circuit, means for applying signal voltages to said first and second circuits, said signal voltages being of predetermined values, and means for applying a control voltage through said circuit means having a magnitude which is either not greater than the smaller of said signal voltages or not less than the larger of said signal voltages.

17. In electrical apparatus the combination comprising a first PNP type transistor, a second NPN type transistor, a first circuit connecting the collector of said first transistor to a point of reference potential such as ground, a second circuit connecting the emitter of said second transistor to said point, circuit means connecting the base of each of said transistors to said point, each through a resistor, said resistors being of equal value, means connecting the emitter of said first transistor to the collector of said second transistor and to a common load circuit, means for applying a control voltage to said bases through said circuit means, and means for applying signal voltages to said first and second circuits, said signal voltages having predetermined maximum and minimum values.

References Cited

UNITED STATES PATENTS

| | | | |
|---|---|---|---|
| 3,069,567 | 12/1962 | Lewis | 307—88.5 |
| 3,125,694 | 3/1964 | Palthe | 307—88.5 |
| 3,177,374 | 4/1965 | Simonian et al. | 307—88.5 |
| 2,956,272 | 10/1960 | Cohler et al. | 340—347 |
| 2,992,409 | 7/1961 | Lawrence | 340—166 |
| 3,112,410 | 11/1963 | Schmid | 307—88.5 |

ARTHUR GAUSS, *Primary Examiner.*

S. D. MILLER, *Assistant Examiner.*